(12) United States Patent
Dufour

(10) Patent No.: US 6,686,806 B2
(45) Date of Patent: Feb. 3, 2004

(54) RING VCO BASED ON RC TIMING

(75) Inventor: Yves Dufour, Sunnyvale, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/738,094

(22) Filed: Dec. 14, 2000

(65) Prior Publication Data

US 2002/0113657 A1 Aug. 22, 2002

(51) Int. Cl.$^7$ .............................................. H03B 27/00
(52) U.S. Cl. ............................. 331/57; 331/46; 331/48; 331/135; 331/143
(58) Field of Search ........................... 331/57, 143, 46, 331/48, 56, 135; 327/182

(56) References Cited

U.S. PATENT DOCUMENTS

| | | | | |
|---|---|---|---|---|
| 4,105,950 A | * | 8/1978 | Dingwall | 331/57 |
| 5,194,831 A | | 3/1993 | Jackson | 331/111 |
| 5,870,004 A | | 2/1999 | Lu | 331/175 |
| 5,939,950 A | * | 8/1999 | Kamei | 331/57 |
| 6,127,898 A | | 10/2000 | Naura | 331/57 |

FOREIGN PATENT DOCUMENTS

| | | | | |
|---|---|---|---|---|
| EP | 0 383 549 | 2/1990 | ............ | H03K/3/03 |
| EP | 0 445 083 | 2/1991 | ............ | H02M/3/07 |

OTHER PUBLICATIONS

Thamsirianunt et al., "CMOS VCO's for PLL Frequency Synthesis in GHz Digital Mobile Radio Communications", Oct. 1997, IEEE Journal of Solid State Circuits, vol. 32, No. 10, pp. 1511–1524.

* cited by examiner

Primary Examiner—Arnold Kinkead
(74) Attorney, Agent, or Firm—Thelen Reid & Priest, LLP

(57) ABSTRACT

The present invention, generally speaking, provides a controlled oscillator that attains the foregoing objectives. The structure of the oscillator is, in general, that of a ring; however, timing of the oscillator is governed largely by an RC time constant. Since the delay is mostly RC-based, phase noise is minimal compared to an active implementation. Furthermore, in a preferred embodiment, two ring oscillators of this type are combined to form a differential oscillator circuit having still lower phase noise. In an exemplary embodiment, the ring oscillators are three-stage ring oscillators. The operation of two inverters is unaffected by the RC time constant. Because the speed of these inverters is very fast compared to the RC time constant, the oscillation frequency is quite constant versus temperature and supply voltage.

5 Claims, 3 Drawing Sheets

RING VCO BASED ON RC TIMING

BACKGROUND OF THE INVENTION

1. Field of the Invention

The present invention relates to controlled oscillators, particularly ring oscillators.

2. State of the Art

Voltage controlled ring oscillators are known. A typical example of a ring VCO (voltage controlled oscillator) is shown in FIG. 1. In its essential form, the oscillator consists merely of a number of inverting stages connected in a ring configuration. The oscillation frequency of the circuit is determined by the gate delay in the inverting stages, which can be controlled by the current through the gate, and the number of gates in the oscillator, and given by $$f_{osc} = \frac{1}{2n\tau_d}$$

where n is the number of inverters in the ring oscillator, and is necessarily odd, and $\tau_d$ is the gate delay per stage.

Variations on the foregoing circuit are used extensively in clock generation and clock recovery circuits, where power consumption and phase noise are not critical. (Clock generation typically requires low cycle-to-cycle jitter, as measured with an oscilloscope, but not low phase noise, as measured with a spectrum and lyzer.)

Because timing of the ring oscillator is set exclusively by active circuits, noise can be quite high. Supply voltage and process/temperature parameters greatly affect operation of the circuit and typically require additional correction circuitry. Moreover, if the signal is not full swing, a high current is needed to extract the frequency. That is, if the clock inside the ring oscillator does not have a 0 to Vdd swing because the supply of the ring is not Vdd, then the low-level signal produced by the ring must be extracted and transformed into a clean signal of 0 to Vdd swing for the rest of the circuit. Such extraction typically involves some kind of amplifier that runs at very high frequency, that consumes significant power, and that may generate substantial phase noise.

Also known are multivibrator VCOs, an example of a class of oscillators known as relaxation oscillators. A typical example of a multivibrator VCO is shown in FIG. 2. The circuit operates with transistors Q1 and Q2 alternatively turning on and off, with capacitor C being discharged through current sources I. Diodes D1 and D2 set the voltage swings at the collectors of Q1 and Q2, and transistors Q3 and Q4 act as level-shifting devices. A square-wave output appears at the collectors of Q1 and Q2, and a triangle wave appears across the capacitor, whose frequency is given by $$f_o = \frac{1}{4CV_{be(on)}}$$

The oscillation frequency is controlled by varying the current I through the current sources, and a wide frequency tuning range can be achieved. Current generation, however, can be noisy. Furthermore, because the triangle wave across the capacitor is symmetrical, the maximum obtainable frequency may be limited.

What is desired is a controlled oscillator that overcomes the foregoing disadvantages, i.e., exhibits low phase noise and allows a high oscillation frequency to be achieved. Other desirable characteristics are low power, low process variation and good supply rejection.

SUMMARY OF THE INVENTION

The present invention, generally speaking, provides a controlled oscillator that attains the foregoing objectives. The structure of the oscillator is, in general, that of a ring; however, timing of the oscillator is governed largely by an RC time constant. Since the delay is mostly RC-based, phase noise is minimal compared to an active implementation. Furthermore, in a preferred embodiment, two ring oscillators of this type are combined to form a differential oscillator circuit having still lower phase noise. In an exemplary embodiment, the ring oscillators are three-stage ring oscillators. The operation of two inverters is unaffected by the RC time constant. Because the speed of these inverters is very fast compared to the RC time constant, the oscillation frequency is quite constant versus temperature and supply voltage.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
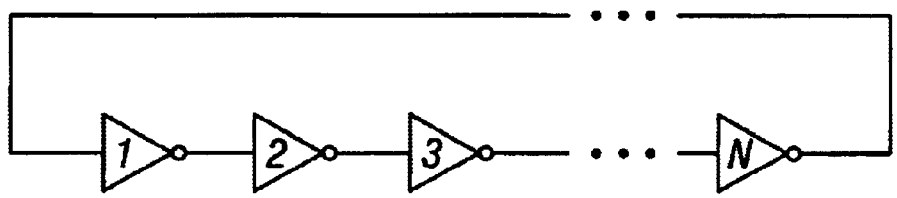
FIG. 1 is a diagram of a known ring VCO.
Figure 2:
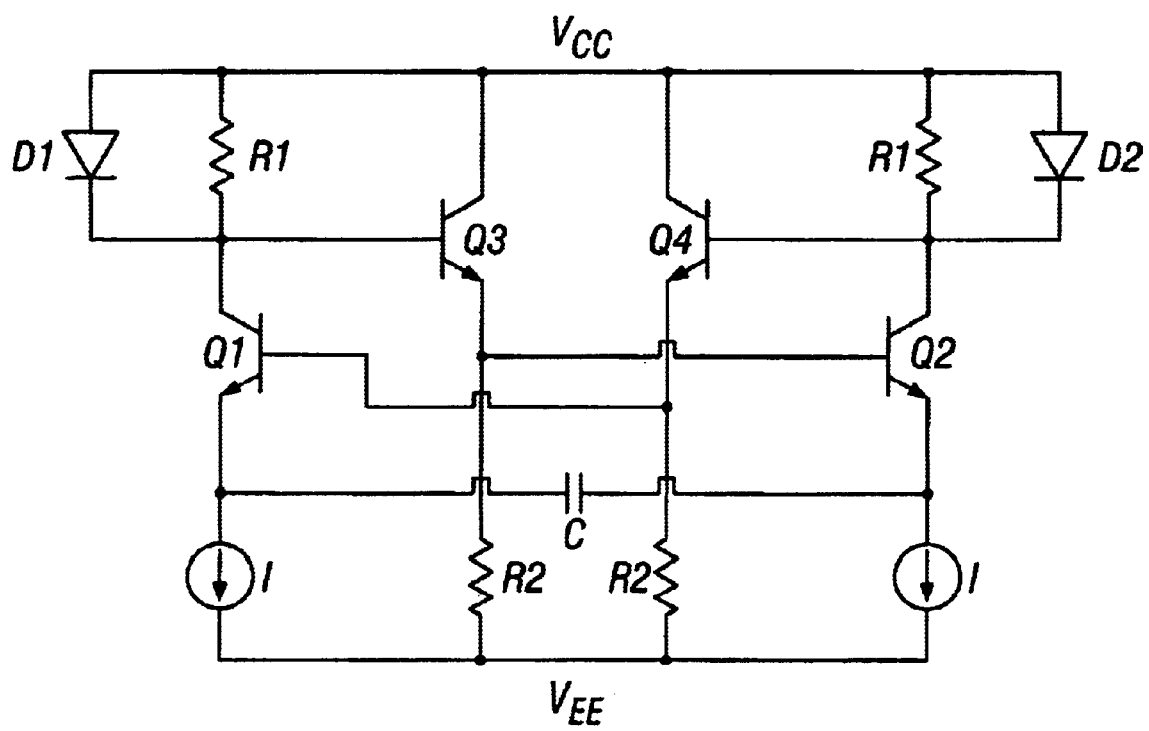
FIG. 2 is a diagram of a known multivibrator VCO.
Figure 3:
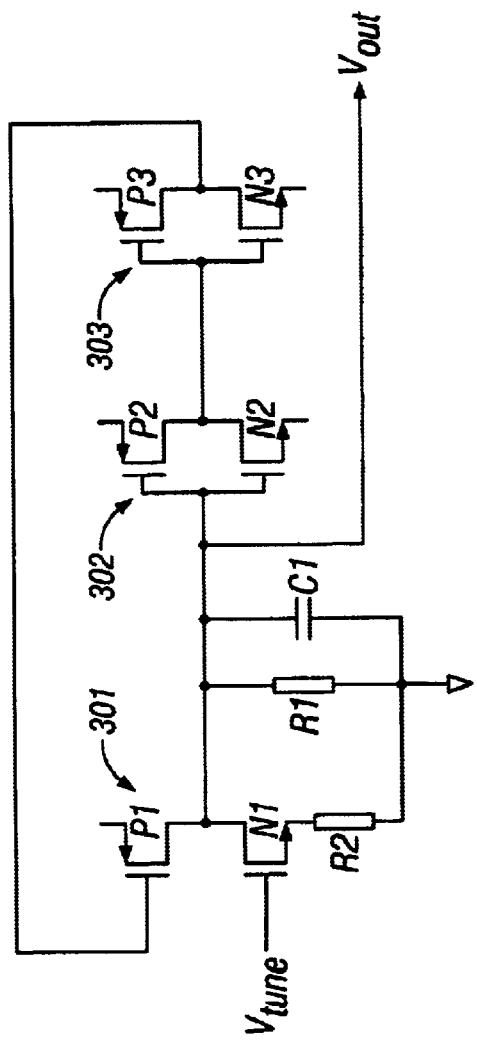
FIG. 3 is a diagram of an embodiment of three-stage ring oscillator having a delay that is RC-based.

Referring now to FIG. 3, a diagram is shown of a three-stage ring oscillator having a delay that is RC-based. Each of the stages 301, 302, 303 is an inverter having a pull-up (P) transistor and a pull-down (N) transistor. In the case of the stages 302 and 303, gates of the transistors are coupled together and receive an input signal to the inverter stage. The source of the P transistor and the drain of the N transistor are coupled together, forming an output signal of the inverter stage. Each of the stages 302, 303 receives as its input signal an output signal of a preceding stage and provides its output signal to serve as the input signal of a succeeding stage.

Stage 301 differs from the stages 302 and 303. In the case of stage 301, gates of the transistors P1 and N1 receive separate input signals: the gate of the transistor P1 receives the output signal of the stage 303. The gate of the transistor N1 receives a control signal, Vtune, that controls the output frequency of the ring VCO.

An RC network is connected between the source of the transistor N1, the output signal of the stage 301, and ground. More particularly, a parallel RC combination R1C1 is connected from the output signal of the stage 301 to ground. The output signal of the stage 301 also forms the output signal of the ring VCO. The RC combination forms a Cste (constant, not tunable) branch that sets the center frequency of the oscillator. A further resistor R2 is connected from the source of the transistor N1 to ground. The resistor R2 forms a Tune branch. These two separate branches allow the center frequency and the gain of the circuit to be adjusted quite independently.

More particularly, most ring VCOs have a zero output frequency for a zero input voltage. As a result, the frequency range covered is very large (0 to Fmax) and the gain (e.g., in Hz/mV) is very large. In the case of the present VCO, the frequency range covered is Fcste to Fmax and the gain is lower. The VCO center frequency is tunable by adjusting the RC time constant R1C1.

Observe that the output voltage of the circuit of FIG. 3 is the voltage across the capacitor C1. This voltage is increased when the pull-up transistor N1 is turned on. It is decreased when the pull-up transistor N1 is turned off. More particularly, a current Icste flows through the resistor R1 that is a function of the voltage across the capacitor C1. A current Itune flows through the resistor R2 that is a function of the voltage across the capacitor C1 and the tuning voltage Vtune applied to the transistor N1. When the pull-up transistor N1 is turned on, these discharge currents are greatly exceeded by a charging current. When the pull-up transistor N1 is turned off, only the discharge currents are present.

Assume for purposes of analysis that the voltage Vout is at a maximum and presents a high logic level to the inverter stage 302. This high logic level is inverted twice by the inverter stages 302 and 303 to cause a high logic level to be applied to the transistor P1, turning it off. The voltage Vout decays in accordance with an uncontrolled current component through R1 and a controlled current component through R2. When the voltage Vout reaches a logic low, then after a small propagation delay through the inverter stages 302 and 303, a logic low signal is applied to the transistor P1, turning it on. The capacitor C1 is then rapidly recharged in a small fraction of the previous discharge time. Hence, the voltage Vout is, for all practical purposes, a single ramp (instead of the symmetrical ramp of the multivibrator VCO, for example).

Note that, for proper operation, Icste should be such that a minimum desired frequency Fmin can be reached for all process and temperature conditions. The sum of Icste and Itune should be such that the maximum desired frequency Fmax can be reached for all process and temperature conditions. By adjusting these two currents, the design may be easily tuned. If desired, one or both of the resistors R1 and R2 may be replaced by switched resistive networks, allowing the effective resistance value to be digitally controlled.

Figure 4:
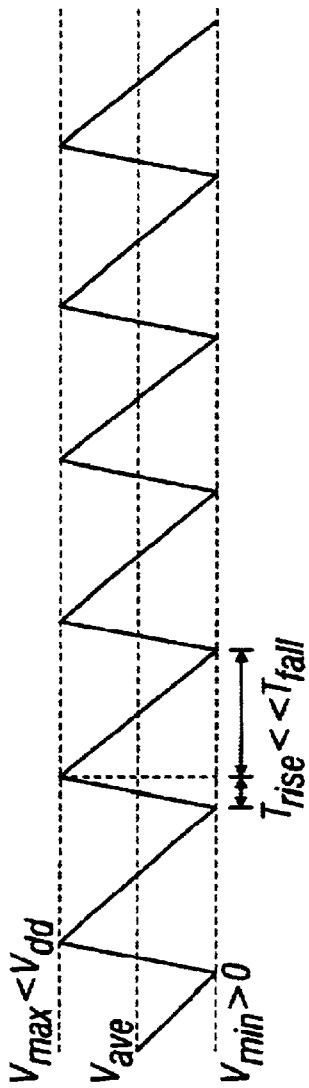
FIG. 4 is a timing diagram of the output signal of the VCO of FIG. 3

The output signal of the VCO of FIG. 3 is shown in FIG. 4. Note that the oscillation is not symmetrical, i.e., Trise <<Tfall. This is because the slow RC combination (R1C1) is only active when the signal is going down. This characteristic is beneficial, however, in that it allows the slow time to be large as compared to the oscillation period, since it is only counted once. The precision requirements for R1C1 are reduced accordingly.

The ring circuit of FIG. 3 is quite useful in its own right. For purposes of frequency synthesis, however, a square-wave output signal is desired.

Figure 5:
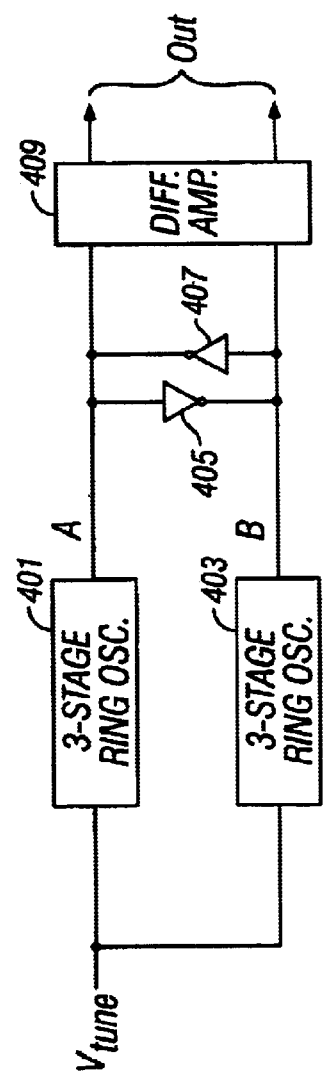
FIG. 5 is a diagram of a differential ring VCO.

Referring now to FIG. 5, a block diagram is shown of a differential ring VCO. Two ring oscillators 401, 403 like that of FIG. 3 are provided. Both ring oscillators receiving the control input Vtune. Output signals of the two ring oscillators are cross-coupled using inverters 405, 407. As a result of such cross-coupling, the two ring oscillators operate 180 degrees apart in phase. This relationship is illustrated in FIG. 5. As seen therein, the positive transition of one of the output signals occurs at substantially the midpoint of the downward ramp of the other out-put signal, and vice versa. The two output signals are input to a differential amplifier 409.

Figure 6:
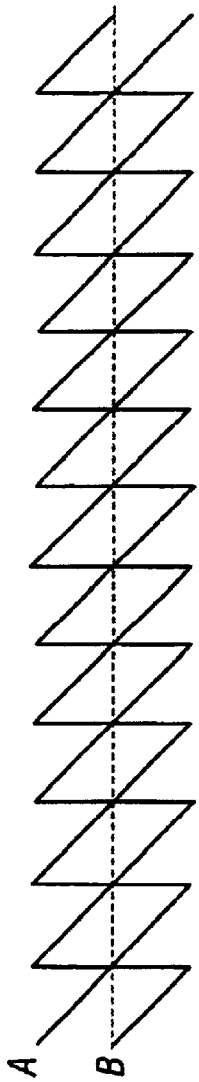
FIG. 6 is a timing diagram showing the output signals of the two ring VCOs of FIG. 5.
Figure 7:
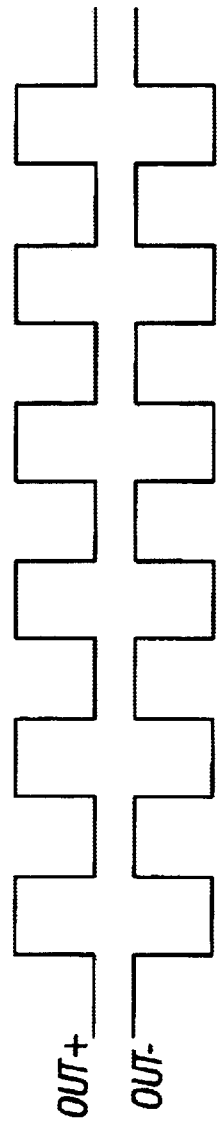
FIG. 7 is a timing diagram showing the differential output signal of the VCO structure of FIG. 5.

In response to the two input signals, the differential amplifier forms two square waves of opposite phase, as illustrated in FIG. 6. That is, the differential amplifier receives as inputs two non-symmetrical signals and produces as an out-put a symmetrical differential signal. In the process of doing so, the noise of the two input signals is averaged on an RMS scale, with the result that noise is reduced by a factor of approximately the square root of two. In addition, the duty cycle of the differential output signal is well-regulated.

Thus, there has been described a controlled oscillator having the general structure of a ring oscillator but in which timing of the oscillator is governed largely by an RC time constant. Phase noise is minimal compared to an active implementation. Two ring oscillators of this type may be combined to form a differential oscillator circuit having still lower phase noise. The oscillation frequency is quite constant versus temperature and supply voltage.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A controlled oscillator, comprising:
   at least one ring oscillator comprising:
      an odd number of inverter stages coupled together in a ring configuration, each inverter stage having an output terminal and at least one input terminal and comprising a pull-up device and a pull-down device;
   for at most one of the inverter stages:
      an RC network coupled within a current path of one of the pull-up device and the pull-down device of the one inverter stage and coupled to an output terminal of the one inverter stage; and
      a control input signal coupled to said one of the pull-up device and the pull-down device of the one inverter stage, an other one of the pull-up device and the pull-down device of the one inverter stage being coupled to an output terminal of a preceding inverter stage in the ring configuration.

2. The controlled oscillator of claim 1, wherein the RC network comprises a parallel RC combination, one end thereof being coupled to the output terminal of the one inverter stage and another end thereof being coupled through a resistor to said one of the pull-up device and the pull-down device of the one inverter stage.

3. The controlled oscillator of claim 1, comprising two ring oscillators as recited in claim 1, each receiving the same control input signal.

4. The controlled oscillator of claim 3, further comprising means for cross-coupling two corresponding nodes in respective ones of said two ring oscillators, and a differential amplifier coupled to said nodes for producing a differential oscillator output signal.

5. The controlled oscillator claim 1, wherein the RC network is a passive RC network comprising a parallel resistor and capacitor combination.

* * * * *

UNITED STATES PATENT AND TRADEMARK OFFICE
CERTIFICATE OF CORRECTION

PATENT NO. : 6,686,806 B2
DATED : February 3, 2004
INVENTOR(S) : Yves Dufour

It is certified that error appears in the above-identified patent and that said Letters Patent is hereby corrected as shown below:

Column 1,
Line 30, replace "and lyzer" with -- analyzer --.

Column 4,
Line 63, after "oscillator" add -- of --.

Signed and Sealed this

Twenty-ninth Day of June, 2004

JON W. DUDAS
*Acting Director of the United States Patent and Trademark Office*